United States Patent [19]

Izaki et al.

[11] Patent Number: 4,884,501
[45] Date of Patent: Dec. 5, 1989

[54] PRESSURE DEVELOPING APPARATUS

[75] Inventors: Takeshi Izaki, Nagoya; Hiroshi Kawahara, Kiyosucho, both of Japan

[73] Assignee: Brother Kogyo Kabushiki Kaisha, Nagoya, Japan

[21] Appl. No.: 131,001

[22] Filed: Dec. 10, 1987

[30] Foreign Application Priority Data

Dec. 19, 1986 [JP] Japan .................. 61-196642

[51] Int. Cl.$^4$ .............................................. B30B 3/04
[52] U.S. Cl. .................................. 100/176; 430/138; 355/295
[58] Field of Search ............... 100/155 R, 158 R, 160, 100/172, 176; 355/3 FU; 118/155, 156; 430/138

[56] References Cited

U.S. PATENT DOCUMENTS

| | | | |
|---|---|---|---|
| 3,871,290 | 3/1975 | Verboom | 100/155 R |
| 4,212,631 | 7/1980 | Franke et al. | 355/3 FU |
| 4,362,502 | 12/1982 | Motomura et al. | 355/3 FU |
| 4,399,209 | 8/1983 | Sanders et al. | 430/138 |
| 4,533,231 | 8/1985 | Shigenobu | 355/3 FU |
| 4,724,303 | 2/1988 | Martin et al. | 355/3 FU |
| 4,727,392 | 2/1988 | Stone et al. | 430/138 |

FOREIGN PATENT DOCUMENTS

| | | | |
|---|---|---|---|
| 8571 | 1/1982 | Japan | 355/3 FU |
| 151176 | 1/1984 | Japan | 355/3 FU |

Primary Examiner—Harvey C. Hornsby
Assistant Examiner—O'Leary K.
Attorney, Agent, or Firm—Kane, Dalsimer, Sullivan, Kurucz, Levy, Eisele and Richard

[57] ABSTRACT

Disclosed is a pressure developing apparatus for pressing a microcapsule sheet carrying photo-sensitive microcapsules applied thereon and having a latent image formed thereon, together with a developer sheet carrying a developer applied thereon, the apparatus comprising a pair of pressure members for pressing the microcapsule and developer sheets therebetween, at least one of the pair of pressure members having a pressing width for pressing the microcapsule sheet together with the developer sheet, the pressing width being selected to be narrower than that of each of the microcapsule sheet and the developer sheet.

1 Claim, 2 Drawing Sheets

FIG_3
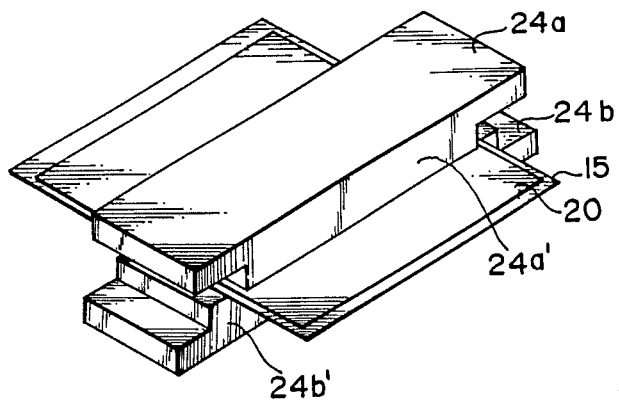
FIG_4 PRIOR ART
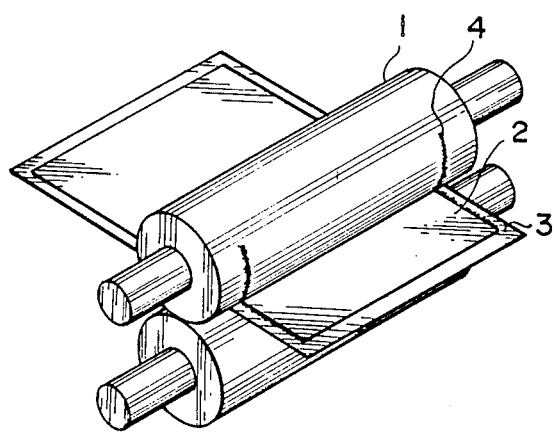

PRESSURE DEVELOPING APPARATUS

BACKGROUND OF THE INVENTION

1. Field of the Invention

The present invention generally relates to a pressure developing apparatus and particularly relates to a pressure developing apparatus in which a microcapsule sheet having photo-sensitive microcapsule applied thereon and carrying a latent image formed thereon and a developer sheet having a developer applied thereon are put on each other and pressed by a pressure means so as to form a picture on the developer sheet.

As the microcapsule sheet and the developer sheet, those disclosed in U.S. Pat. No. 4,399,209 may be used.

2. Description of the Prior Art

In the pressure developing apparatus in which a microcapsule sheet having photo-sensitive microcapsule applied thereon and carrying a latent image formed thereon and a developer sheet having a developer applied thereon are put on each other and pressed by a pressure means so as to form a picture on the developer sheet, it is very important to keep even the respective surfaces of a pair of pressure rollers used as the pressure means. This is because if the respective surfaces of the pressure rollers are uneven, the coloring density of a color developed on a developer sheet. It has been known, however, that dirt mainly containing a binder for fixing photosensitive microcapsules on a microcapsule sheet and the contents of microcapsules adheres on the surface of pressure rollers of the pressure developing apparatus of the kind described above.

The reason why such dirt containing a binder and so on adheres on the surface of a pressure rollers will described by using FIG. 4. A microcapsule sheet 2 and a developer sheet 3 are put on each other and are being pressed across the width of the sheets between a pair of pressure rollers 1. By the pressing force, a binder 4 and so on are pushed out from the edge of the microcapsule sheet at a portion of the sheet sandwiched between the pressure rollers 1, so that the pushed out binder and so on adhere onto the surface of the pressure roller and the developer sheet. The wider the width of the microcapsule sheet than the width of the developer sheet is, the more remarkable the adhesion of the pushed out binder and so onto the surface of the pressure roller becomes. How to perfectly carry out cleaning of the pressure roller is one of the most important point for the pressure developing apparatus of the kind described above in order to keep good quality of a picture formed by the pressure recording apparatus.

It is therefore an object of the present invention to solve the above problem in the prior art pressure recording apparatus.

It is another object of the present invention to provide a pressure recording apparatus in which no dirt is generated on a pressure means.

In order to attain the above objects, according to the present invention, the pressure developing apparatus for pressing a microcapsule sheet carrying photo-sensitive microcapsules applied thereon and having a latent image formed thereon, together with a developer sheet carrying a developer applied thereon, comprises a pair of pressure members for pressing the microcapsule and developer sheets therebetween, at least one of the pair of pressure members having a pressing width for pressing the microcapsule sheet together with the developer sheet, the pressing width being selected to be narrower than that of each of the microcapsule sheet and the developer sheet.

Since the pressing width of the pressure member is made narrower than that of each of the microcapsule sheet and the developer sheet, the edge portions of the microcapsule and developer sheets are not pressed so that a binder and the contents of microcapsules disposed at the edge portion of the microcapsule sheet is not pushed out from the edge portion of the sheet.

BRIEF DESCRIPTION OF THE DRAWINGS

Above and other objects, features and advantages of the present invention will appear more fully from the following description in conjunction with the accompanying drawings, in which:

FIG. 3 is a perspective view showing a main part of another embodiment of the present invention; and FIG. 4 is a perspective view showing a main part of the prior art.

DESCRIPTION OF THE PREFERRED EMBODIMENTS

Figure 1:
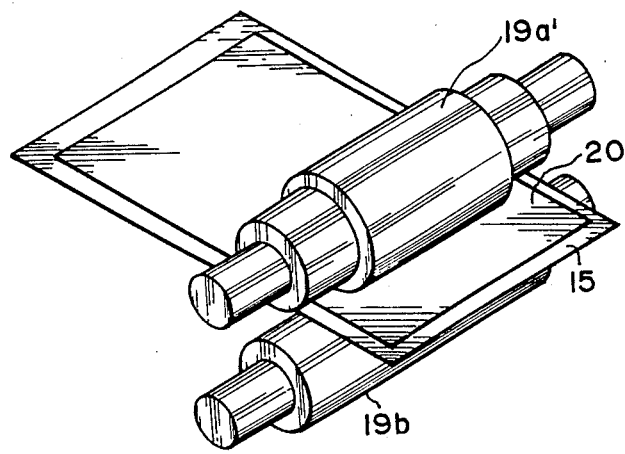
FIG. 1 is a perspective view showing a main part of an embodiment of the present invention.
Figure 2:
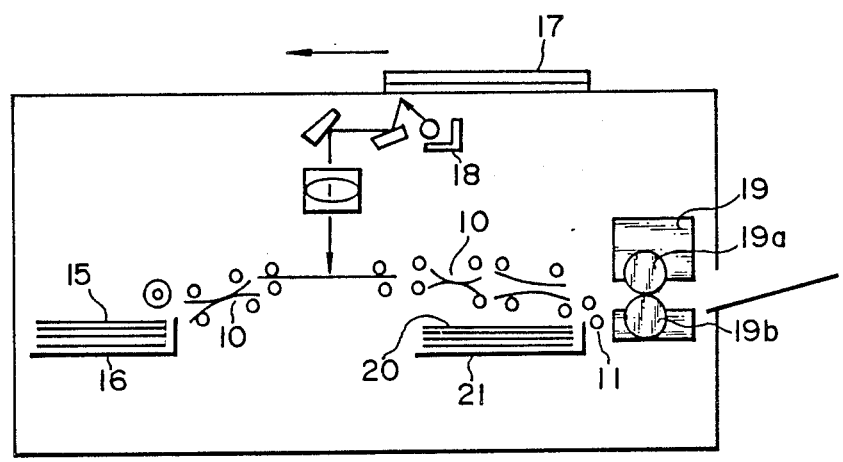
FIG. 2 is a cross section showing the whole of the embodiment of FIG. 1.

Referring to FIGS. 1 and 2, an embodiment of the pressure recording apparatus according to the present invention will be described.

As shown in FIG. 2, a sheet accommodation cassette 16 for accommodating microcapsule sheets 15 is removably mounted in a copying apparatus 14 at its left side. On an upper surface of the copying apparatus 14, an original mount 17 is provided and arranged to be moved leftward in the drawing by a not-shown conveyer. In the copying apparatus 14, the microcapsule sheet 15 can be moved by a conveyer 10 from left to right in the drawing, in synchronism with the movement of the original mount 17. A light source 18 for irradiating an original put on the original mount 17 is provided under the original mount 17, so that the light radiated from the light source 18 is reflected on the original so as to be focused on the microcapsule sheet 15 being moved in the copying apparatus 14 to thereby form a latent image on the microcapsule sheet 15 in accordance with the original. The microcapsule sheet 15 on which the latent image has been formed is conveyed by the conveyer 10 to a pressure developing device 19 provided in the apparatus 14 at its right side in the drawing. Another sheet accommodation cassette 21 for accommodating developer sheets 20 is provided under the conveyor 10, so that the developer sheet 20 is conveyed by another conveyer 11 to the pressure developing device 19. The pressure developing device 19 is provided with a pair of pressure rollers 19a and 19b. The microcapsule sheet 15 and the developer sheet 20 conveyed by the conveyers 10 and 11 respectively are put on each other and pressed by the pair of pressing rollers 19a and 19b so that the latent image formed on the microcapsule sheet 15 is developed on the developer sheet 20.

FIG. 1 is an enlarged perspective view of a main part of the pressure development device according to the present invention. A stepped portion 19a' is formed on one of the pressure rollers, that is, on the upper roller 19a in the illustrated embodiment, while no stepped portion is formed on the lower pressure roller 19b. A microcapsule sheet 15 and a developer sheet 20 are put together and inserted between the upper and lower rollers 19a and 19b. Both the pressure rollers are rotated by a pressure roller driving mechanism (not shown), the latent image carried by the microcapsule sheet is successively developed on the developer sheet 20. Since the width of the stepped portion 19a' of the upper pressure roller 19 is selected to be narrower than that of each of the microcapsule and developer sheets 15 and 20, the edge portions of the microcapsule sheet 15 do not receive the pressing force by the pressure rollers so that such a phenomenon that a binder and so on are pushed out from the edge portions of the microcapsule sheet 15 and adhere to the pressure roller can be prevented from occurring.

In the above embodiment, the reason why no stepped portion is formed on the lower pressure roller 19b is that the back surface of the microcapsule sheet 15 is made to come into contact and the lower pressure roller 19b on one hand and the developer sheet 20 is selected to be sufficiently smaller than the microcapsule sheet 15. In the case where the microcapsule sheet 15 and the developer sheet 20 are substantially equal to each other in size, it is necessary to form a stepped portion on the lower pressure roller 19b similarly to the stepped portion 19a' of the upper pressure roller 19a. The positions of the stepped portions of the pressure rollers 19a and 19b are determined in accordance with the size of each of the microcapsule sheet 15 and the developer sheet 20, the size and position of a picture to be recorded. Generally, the pressing width suffices if it is selected to be narrower by about 5 mm than the width of the sheet.

The present invention is not limited to the above embodiment but a modification can be made as shown in FIG. 3. In the embodiment shown in FIG. 3, the pressure rollers 19a and 19b of the first embodiment are replaced by generally rectangular pressure members 24a and 24b respectively having flat stepped portions 24a' and 24b' formed on the opposite surfaces of the pressure members 24a and 24b. The pressing width of the pressing members is made narrower than the width of each of each of the microcapsule sheet 15 and the developer sheet 20 and the same effect as in the first embodiment can be obtained.

As is apparent from the foregoing description, in the pressure developing apparatus according to the present invention, no dirt containing a binder, the contents of photosensitive microcapsules, etc. adheres on the surface of the pressure means so that a clear picture can be recorded on the recording sheet.

What is claimed is:
1. A pressure developing system including a first sheet containing thereon photo-sensitive microcapsules and having a latent image formed thereon, a second sheet containing thereon a developer for developing said latent image, and a developing apparatus including a pair of pressure rollers for pressing said first and second sheets together therebetween, at least one of said rollers having a stepped portion having a width narrower than the width of either of said sheets whereby the edges of said sheets are not subjected to any pressing force from said pressure rollers.

* * * * *